US006826085B2

(12) United States Patent
Shimasaki

(10) Patent No.: US 6,826,085 B2
(45) Date of Patent: Nov. 30, 2004

(54) NONVOLATILE SEMICONDUCTOR MEMORY DEVICE CAPABLE OF ACCURATELY AND QUICKLY ADJUSTING STEP-UP VOLTAGE

(75) Inventor: Shinya Shimasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/750,970

(22) Filed: Jan. 5, 2004

(65) Prior Publication Data

US 2004/0141376 A1 Jul. 22, 2004

(30) Foreign Application Priority Data

Jan. 16, 2003 (JP) ........................................ 2003-008088

(51) Int. Cl.[7] ........................... G11C 16/04; G11C 16/06
(52) U.S. Cl. .............................. 365/185.2; 365/185.21; 365/185.33
(58) Field of Search ...................... 365/185.2, 185.21, 365/185.33

(56) References Cited

U.S. PATENT DOCUMENTS 5,553,021 A * 9/1996 Kubono et al. ........ 365/185.33
6,038,173 A * 3/2000 Yero ....................... 365/185.2
6,351,417 B1 * 2/2002 Shiga et al. ............. 365/185.2
6,563,737 B2 * 5/2003 Khouri et al. ......... 365/185.21

FOREIGN PATENT DOCUMENTS

JP          2000-113690 A       4/2000

* cited by examiner

Primary Examiner—Trong Phan
(74) Attorney, Agent, or Firm—Sughrue Mion, PLLC

(57) ABSTRACT

In a nonvolatile semiconductor memory device including a nonvolatile cell circuit, a step-up circuit receives a clock signal to generate a step-up voltage for the nonvolatile cell circuit. A voltage divider divides the step-up voltage to generate a plurality of voltages. A selector selects one of the voltages. A reference voltage generating circuit generates a reference voltage. A first comparator compares the selected one of the voltages with the reference voltage. A gate circuit supplies the clock signal to the step-up circuit in accordance with an output signal of the first comparator so that the selected one of the voltages is brought close to the reference voltage. Also, a second comparator compares the step-up voltage with an externally-provided expected value. A counting signal generating circuit generates a counting signal in accordance with an output signal of the first comparator. A counter changes a value thereof by receiving the counting signal. Thus, the selector selects the one of the voltages in accordance with the value of the counter, so that the step-up voltage is brought close to the expected value.

9 Claims, 6 Drawing Sheets

NONVOLATILE SEMICONDUCTOR MEMORY DEVICE CAPABLE OF ACCURATELY AND QUICKLY ADJUSTING STEP-UP VOLTAGE

BACKGROUND OF THE INVENTION

1. Field of the Invention

The present invention relates to a nonvolatile semiconductor memory device, and more particularly, to the adjustment of a step-up voltage thereof.

2. Description of the Related Art

In a nonvolatile semiconductor memory device such as a flash electrically erasable and programmable read only memory (EEPROM) device, a step-up voltage higher than an external power supply voltage is required for a write operation and an erase operation. Usually, such a step-up voltage is internally generated by using a step-up circuit.

The lower the step-up voltage, the larger the number of defective write/erase operations. On the other hand, the higher the step-up voltage, the shorter the life time of the device. Therefore, it is important to adjust the step-up voltage to a desired value. Note that this desire value is preferably a little higher than the minimum voltage by which a write or erase operation can be carried out.

In a prior art nonvolatile semiconductor device, in order to decrease a writing operation time and improve the reliability, the step-up voltage is gradually changed during a write operation (see: JP-A-2000-113690).

In the above-described prior art nonvolatile semiconductor memory device, however, since it is not easy to adjust the step-up voltage accurately and quickly, the device would be deemed to be defective and scrapped in spite of the fact that the device can be normally operated, which would decrease the manufacturing yield.

SUMMARY OF THE INVENTION

It is an object of the present invention to provide a nonvolatile semiconductor memory device capable of accurately and quickly adjusting a step-up voltage.

According to the present invention, in a nonvolatile semiconductor memory device including a nonvolatile cell circuit, a step-up circuit receives a clock signal to generate a step-up voltage for the nonvolatile cell circuit. A voltage divider divides the step-up voltage to generate a plurality of voltages. A selector selects one of the voltages. A reference voltage generating circuit generates a reference voltage. A first comparator compares the selected one of the voltages with the reference voltage. A gate circuit supplies the clock signal to the step-up circuit in accordance with an output signal of the first comparator so that the selected one of the voltages is brought close to the reference voltage. Also, a second comparator compares the step up voltage with an externally-provided expected value. A counting signal generating circuit generates a counting signal in accordance with an output signal of the first comparator. A counter changes a value thereof by receiving the counting signal. Thus, the selector selects the one of the voltages in accordance with the value of the counter, so that the step-up voltage is brought close to the expected value.

BRIEF DESCRIPTION OF THE DRAWINGS

The present invention will be more clearly understood from the description set forth below, with reference to the accompanying drawings, wherein.

DESCRIPTION OF EXEMPLARY EMBODIMENTS

Figure 1:
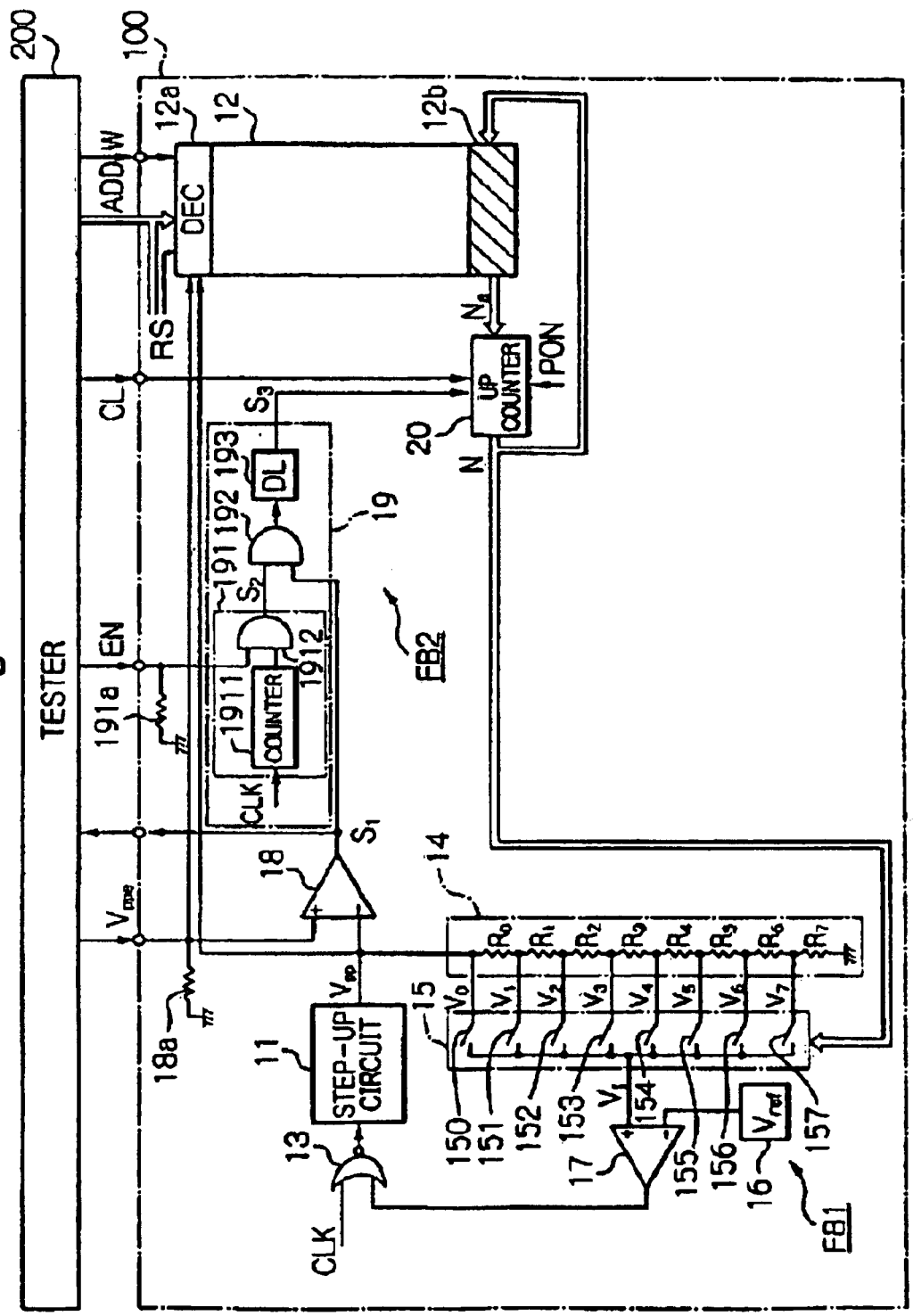
FIG. 1 is a circuit diagram illustrating a first embodiment of the nonvolatile semiconductor memory device according to the present invention.
Figure 6:
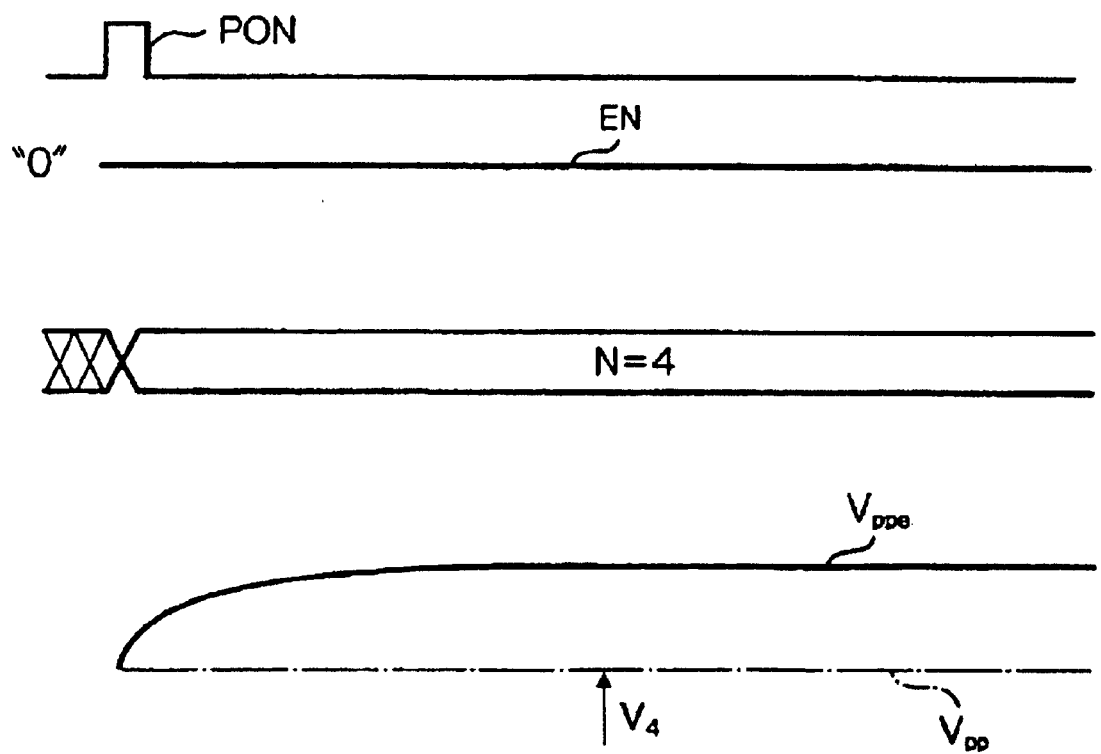

Throughout the figures, certain reference characters are used to illustrate various exemplary aspects of the invention. The following reference characters are used in various figures: XX, $V_3$, $V_4$, $V_5$, PON, "0", EN, $V_{pp}$ and $V_{ppe}$. The previous reference characters are to be given the following non-limiting, exemplary meanings:

XX is an algebraic value held in the counter 20 prior to the counter 20 having received the "clear signal," CL. $V_1$ through $V_7$ represents different voltages created by voltage divider 14 through resistors $R_1$ through $R_7$ respectively. PON is a power-on-signal representing the fact that power has been turned on to the device. "0" (particularly as shown in FIG. 6), illustrates the fact that "EN" signal (enablement signal) is currently at a "zero" or "low" state. "EN" is a signal generated by the tester 200 that enables the generation of a sampling signal $S_2$ and a count-up (or count-down) signal $S_3$. $V_{pp}$ is a step-up (or step-down) voltage, and $V_{ppe}$ is an exemplary voltage against which $V_{pp}$ is compared. Further exemplary embodiments are both illustrated in the figures and described in the following written description.

In FIG. 1, which illustrates a first embodiment of the nonvolatile semiconductor memory device according to the present invention, a nonvolatile semiconductor memory device 100 is connected to a tester 200.

In FIG. 1, a step-up circuit 11 including a charge pump circuit generates a step-up voltage $V_{pp}$ and transmits it to a nonvolatile cell circuit 12, particularly, its decoder portion 12a.

The step-up voltage $V_{pp}$ of the step-up circuit 11 is determined by receiving a clock signal CLK via a NOR circuit 13. In this case, the step-up voltage $V_{pp}$ is controlled by a first feedback circuit FB1 connected between the step-up circuit 11 and the NOR circuit 13, so that the output voltage $V_i$ of a selector 15 is brought close to the reference voltage $V_{ref}$ of a reference voltage generating circuit 16. That is, $$V_i = V_{ref}$$

The first feedback circuit FB1 will next be explained in detail.

The first feedback circuit FB1 is formed by a voltage divider 14, the selector 15, the reference voltage generating circuit 16 and a comparator 17.

The voltage divider 14 is constructed by a ladder of resistors between the output of the step-up circuit 11 and the ground terminal GND. For example, eight resistors whose resistance values are defined by $R_{11}, R_1, \ldots, R_7$ is provided. In this case, voltages $V_0, V_1, \ldots, V_7$ can be defined by $$V_0 = V_{pp}$$

$$V_1 = (R_1 + R_2 + \ldots + R_7) V_{pp}/R$$

$$V_2 = (R_2 + R_3 + \ldots + R_7) V_{pp}/R \ldots$$

$$V_7 = R_7 \cdot V_{pp}/R$$

where $R = R_0 + R_1 + \ldots + R_7$

The selector 15 is constructed by eight switches 150, 151, ..., 157. Therefore, when the switches 150, 151, ..., 157, are respectively, and individually turned ON, the step-up voltage $V_{pp}$ is brought close to:

$$V_{pp}=V_0=V_{ref}$$

$$V_{pp}=V_1=R \cdot V_{ref}/(R_1+R_2+\ldots+R_7)$$

$$V_{pp}=V_2=R \cdot V_{ref}/(R_2+R_3+\ldots+R_7) \ldots$$

$$V_{pp}=V_7=R \cdot V_{ref}/R_7$$

For example, if the values of the resistors $R_0, R_1, \ldots, R_7$ are the same as each other, the step-up voltage $V_{pp}$ is brought close to:

$$V_{pp}=V_0=1.5V$$

$$V_{pp}=V_1=1.71V$$

$$V_{pp}=V_2=2.0V \ldots$$

$$V_{pp}=V_7=12V$$

The selector 15 is controlled by a second feedback circuit FB2 connected between the output of the step-up circuit 11 and the selector 15, so that the step-up voltage $V_{pp}$ is brought close to an expected voltage $V_{ppe}$ from the tester 200. That is, $$V_{pp}=V_{ppe}$$

The second feedback circuit FB2 will next be explained in detail.

The second feedback circuit FB2 is formed by a comparator 18, a count-up signal generating circuit 19 and an up counter 20.

The comparator 18 compares the step-up voltage $V_{pp}$ with the expected voltage $V_{ppe}$ to generate a comparison signal $S_1$. Note that the comparison signal $S_1$ is also supplied to the tester 200.

The count-up signal generating circuit 19 is constructed by a sampling signal generating circuit 191 for generating a sampling signal $S_2$, an AND circuit 192 for passing the sampling signal in accordance with the comparison signal $S_1$, and a delay circuit 193 for delaying the output signal of the AND circuit 192 to generate a count-up signal $S_3$. Note that the sampling signal generating circuit 191 is constructed by a counter 1911 for counting pulses of the clock signal CLK to generate a timing signal having a predetermined time period and an AND circuit 1912 for passing the timing signal in accordance with an enable signal EN from the tester 200.

The value N of the up counter 20 is cleared by a clear signal CL from the tester 200, and is counted up by receiving the count-up signal $S_3$ from the count-up signal generating circuit 19. When the adjustment of the value N of the up counter 20 is completed, the value N is stored as an adjusted value $N_a$ in an adjustment area 12b of the nonvolatile cell circuit 12.

Also, after the adjustment of the value N of the up counter 20, when the tester 200 is separated from the nonvolatile semiconductor device 100, the adjusted value $N_a$ of the adjustment area 12b of the nonvolatile cell circuit 12 is set in the counter 20 by a power-on signal PON.

Further, the tester 200 supplies an address signal ADD, a write signal W and the expected voltage $V_{ppe}$ to the nonvolatile cell circuit 12 to operate the nonvolatile cell circuit 12 even in an adjustment mode of the value N of the up counter 20.

Figure 2:
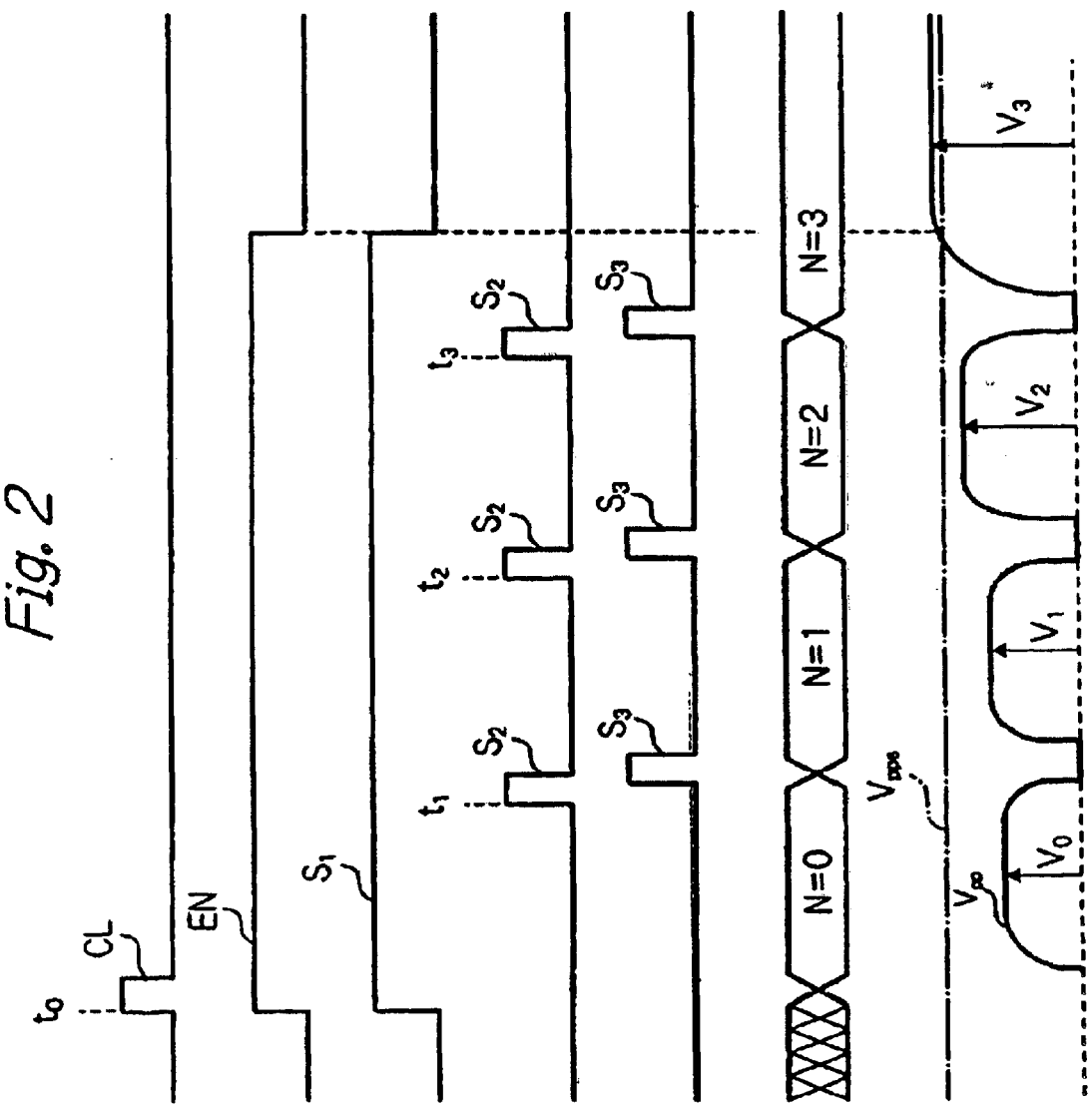
FIGS. 2 and 3 are timing diagrams for explaining the nonvolatile semiconductor memory device of FIG. 1.

The adjustment operation of the nonvolatile semiconductor device 100 of FIG. 1 by the tester 200 will be explained next with reference to FIG. 2. Note that the value N of the counter 20 is indefinite before time $t_0$.

First, at time $t_0$, the tester 200 generates a clear signal CL. As a result, the value N of the counter 20 is cleared, i.e., $$N=0$$

Also, the tester 200 generates an enable signal EN, so that the sampling signal generating circuit 191 is enabled.

In this state (N=0), the step-up voltage $V_{pp}$ is brought close to $V_0$ by the first feedback circuit FB1; that is, the counter 20 is at state N=0, and this signal is fed to selector 15, which selectively chooses $V_0$ by closing the respectively associated switch (switch 150) so that $V_0$ becomes $V_{pp}$; however the step-up voltage $V_{pp}$ is still below the expected value $V_{ppe}$, so that the comparison signal $S_1$ remains high (="1").

Next, at time $t_1$, a sampling signal $S_2$ is generated from the sampling signal generating circuit 191, and subsequently, a count-up signal $S_3$ is generated from the count-up signal generating circuit 19. As a result, the value N of the up counter 20 is counted up by +1, so that $$N=1$$

In this state (N=1), the step-up voltage $V_{pp}$ is brought close to $V_1$ by the first feedback circuit FB1; that is, the counter 20 is at state N=1, and this signal is fed to selector 15, which selectively chooses $V_1$ by closing the respectively associated switch (switch 150) so that $V_1$ becomes $V_{pp}$; however the step-up voltage $V_{pp}$ is still below the expected value $V_{ppe}$, so that the comparison signal $S_1$ remains high (="1").

Next, at time $t_2$, a sampling signal $S_2$ is generated from the sampling signal generating circuit 191, and subsequently, a count-up signal $S_3$ is generated from the count-up signal generating circuit 19. As a result, the value N of the up counter 20 is counted up by +1, so that $$N=2$$

In this state (N=2), the step-up voltage $V_{pp}$ is brought close to $V_2$ by the first feedback circuit FB1; that is, the counter 20 is at state N=2, and this signal is fed to selector 15, which selectively chooses $V_2$ by closing the respectively associated switch (switch 152) so that $V_2$ becomes $V_{pp}$; however the step-up voltage $V_{pp}$ is still below the expected value $V_{ppe}$, so that the comparison signal $S_1$ remains high (="1").

Next, at time $t_3$, a sampling signal $S_2$ is generated from the sampling signal generating circuit 191, and subsequently, a count-up signal $S_3$ is generated from the count-up signal generating circuit 19. As a result, the value N of the up counter 20 is counted up by +1, so that $$N=3$$

In this state (N=3), the step-up voltage $V_{pp}$ is brought close to $V_3$ by the first feedback circuit FB1, so that the step-up voltage $V_{pp}$ exceeds the expected value $V_{ppe}$; that is, the counter 20 is at state N=3, and this signal is fed to selector 15, which selectively chooses $V_3$ by closing the respectively associated switch (switch 153) so that $V_3$ becomes $V_{pp}$. Thus, the comparison signal $S_1$ is switched form high ("1") to low (="0"), so that the step-up voltage $V_{pp}$ is brought close to the expected voltage $V_{ppe}$ by the second feedback circuit FB2.

As a result, upon receipt of the change of the comparison signal $S_1$, the tester 200 stops the generation of the enable signal EN, so that the sampling signal $S_2$ and the count-up signal $S_3$ are no longer generated. Thus, the adjustment of the value N of the up counter 20 is completed, i.e., the value N of the up counter 20 is fixed at "3".

Finally, the tester 200 supplies a write signal W and an address signal ADD indicating the adjustment area 12b, so that the value "3" of the up counter 20 is stored in the adjustment area of the nonvolatile cell circuit 12.

Figure 3:
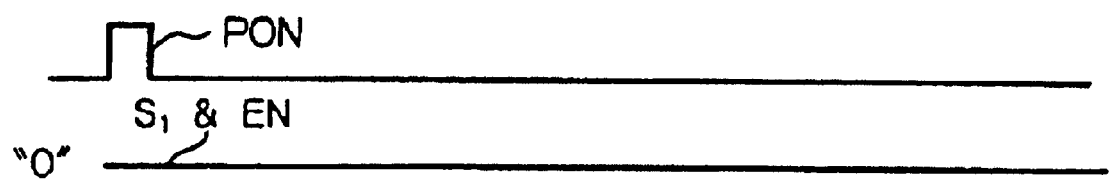
Figure 3:
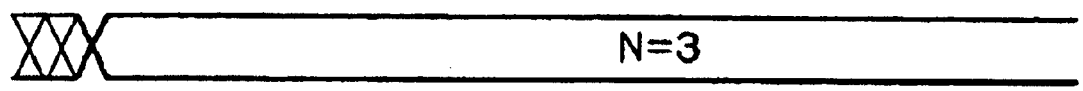
Figure 3:
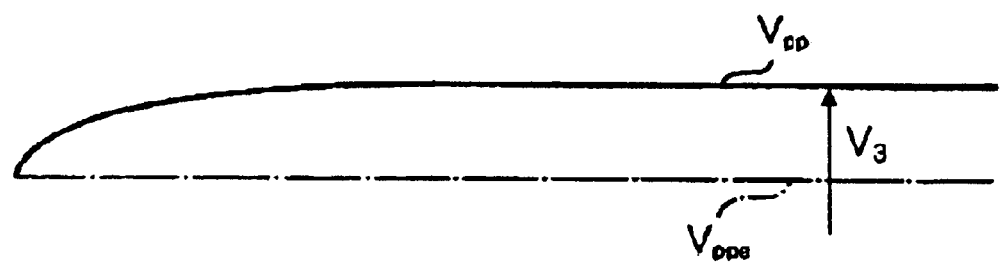

The post-adjustment operation of the nonvolatile semiconductor memory device of FIG. 1 will be explained next with reference to FIG. 3. Here, assume that the value "3" is stored in the adjustment area 12b of the nonvolatile cell circuit 12.

First, a power-on signal PON is generated from a control circuit (not shown) which also generates a read signal RS and an address signal ADD indicating the adjustment area 12b. Therefore, the value "3" is transferred from the adjustment area 12b of the nonvolatile cell circuit 12 to the up counter 20. As a result, the step-up voltage $V_{pp}$ is brought close to $V_3$ by the first feedback circuit FBI. In the case, since the enable signal EN remains low (=0) due to the presence of a resistor 191a, no sampling signal $S_2$ and no count-up signal $S_3$ are generated. Thus, the value "3" of the up counter 20 is unchanged.

In FIG. 1, a resistor 18a having a relatively large resistance is connected to a terminal to which the expected value $V_{ppe}$ is applied. As a result, in the post-adjustment operation, since the expected value $V_{ppe}$ is 0V, the generation of the count-up signals can be further suppressed, which more surely prevents a change in the value of the counter 20.

Figure 4:
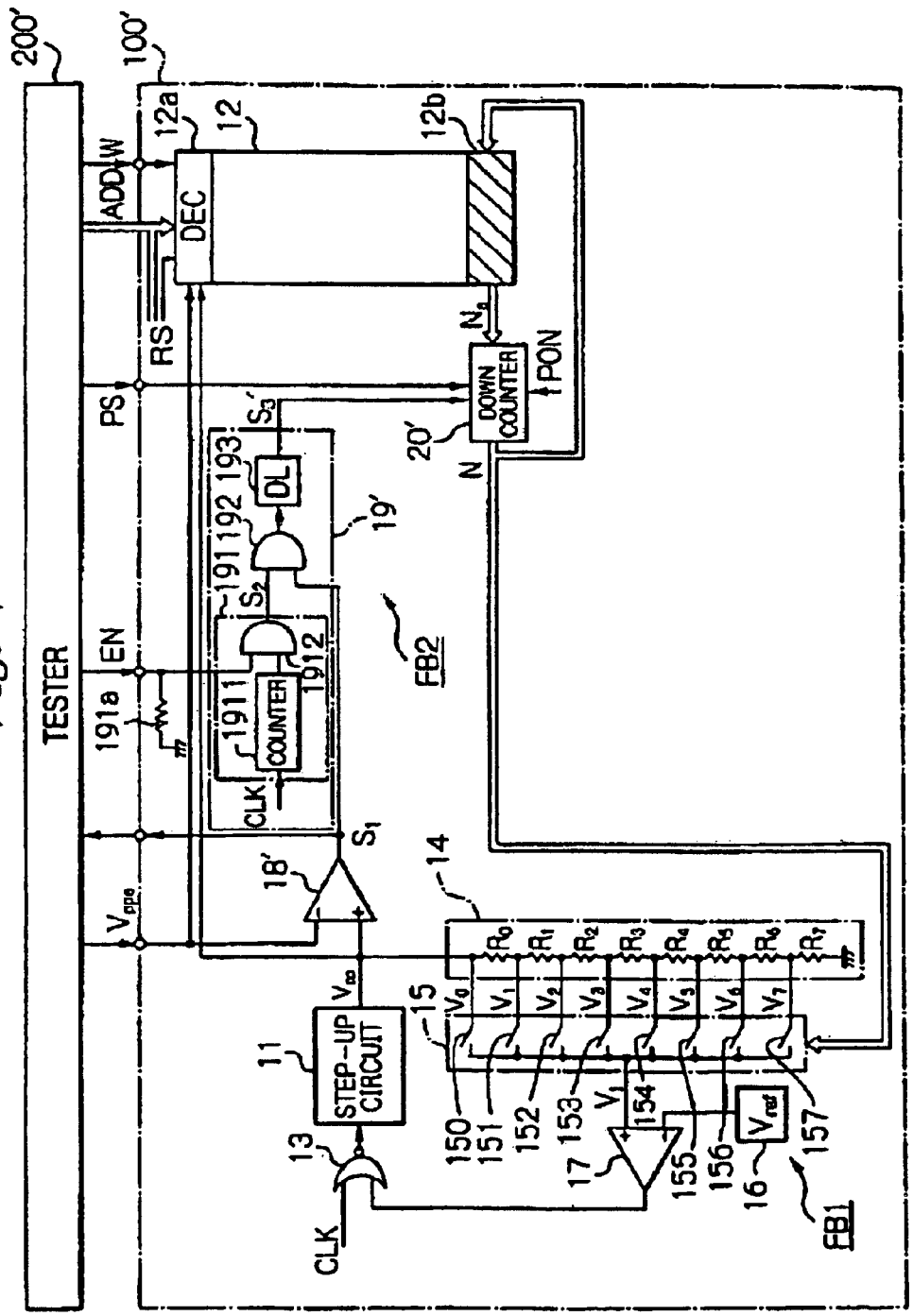
FIG. 4 is a circuit diagram illustrating a second embodiment of the nonvolatile semiconductor memory device according to the present invention.

In FIG. 4, which illustrates a second embodiment of the nonvolatile semiconductor memory device according to the present invention, a nonvolatile semiconductor memory device 100' is connected to a tester 200'.

In the nonvolatile semiconductor memory device 100', the comparator 18 of FIG. 1 is replaced by a comparator 18' whose output polarity is opposite to that of the comparator 18 of FIG. 1. Also, the up counter 20 of FIG. 1 is replaced by a down counter 20', and the tester 200' generates a preset signal PS for the down counter 20' instead of the clear signal CL of FIG. 1. Note that the count-up signal generating circuit 19 of FIG. 1 is replaced by a count-down signal generating circuit 19'; however, the count-down signal generating circuit 19' has the same configuration as the count-up signal generating circuit 19 of FIG. 1.

The value N of the down counter 20' is preset by a preset signal PS from the tester 200' to a preset value such as "7", and is counted down by receiving the count-down signal $S_3'$ from the count-down signal generating circuit 19'. When the adjustment of the value N of the down counter 20' is completed, the value N is stored as an adjusted value $N_a$ in the adjustment area 12b of the nonvolatile cell circuit 12.

Also, after the adjustment of the value N of the down counter 20', when the tester 200' is separated from the nonvolatile semiconductor device 100', the adjusted value $N_a$ of the adjustment area 12b of the nonvolatile cell circuit 12 is set in the down counter 20' by a power-on signal PON.

Further, the tester 200' supplies an address signal ADD, a write signal W and the expected voltage $V_{ppe}$ to the nonvolatile cell circuit 12 to operate the nonvolatile cell circuit 12 even in an adjustment mode of the value N of the down counter 20'.

Figure 5:
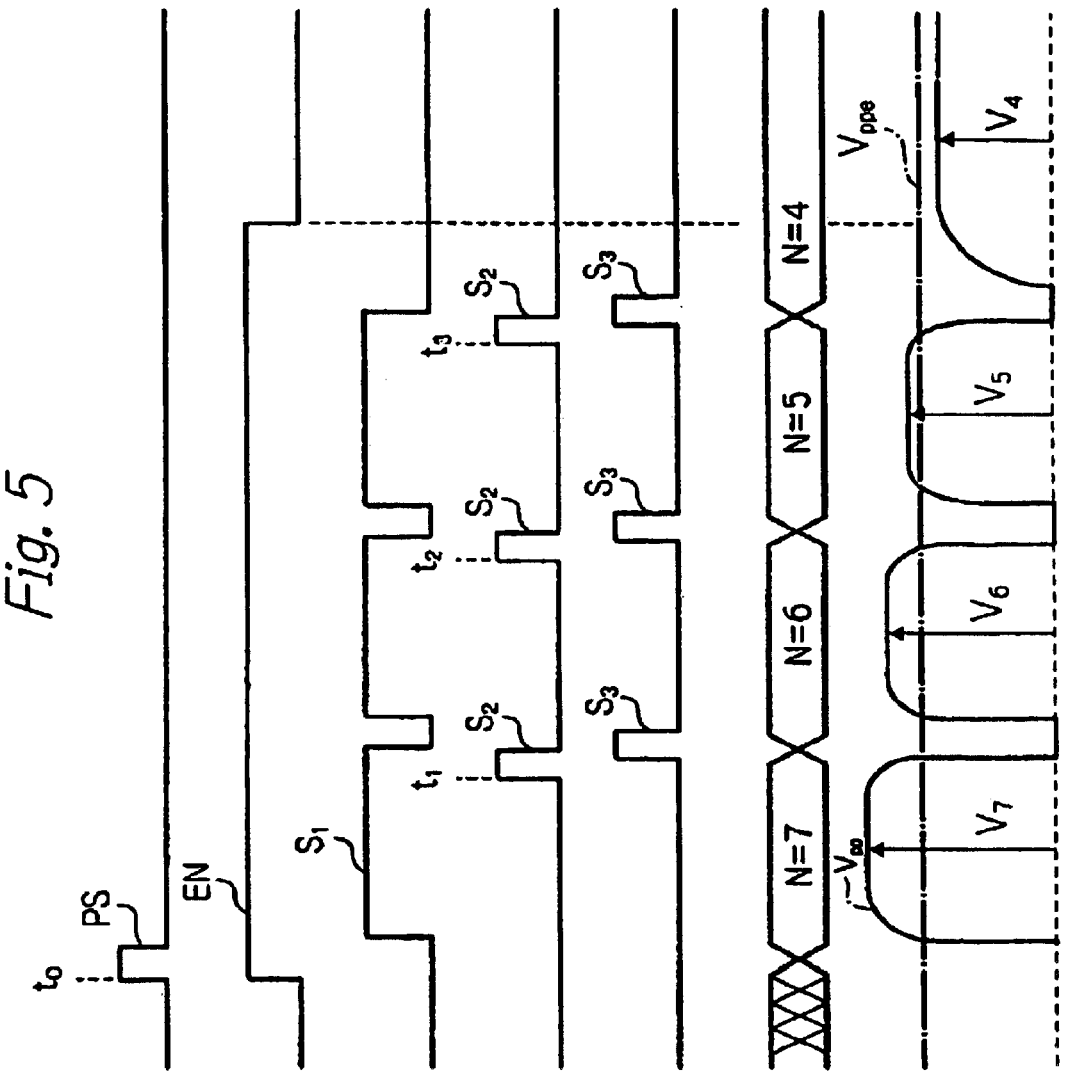
FIGS. 5 and 6 are timing diagrams for explaining the nonvolatile semiconductor memory device of FIG. 4.

The adjustment operation of the nonvolatile semiconductor device 100' of FIG. 4 by the tester 200' will be explained next with reference to FIG. 5. Note that the value N of the counter 20' is indefinite before time $t_0$.

First, at time $t_0$, the tester 200' generates a preset signal PS. As a result, the value N of the counter 20' is preset, i.e.,

N=7

Also, the tester 200' generates an enable signal EN, so that the sampling signal generating circuit 191 is enabled.

In this state (N=7), the step-up voltage $V_{pp}$ is brought close to $V_7$ by the first feedback circuit FBI; that is, counter 20 is at state N=7, and this signal is fed to selector 15, which selectively chooses $V_7$ by closing the respectively associated switch (switch 157) so that $V_7$ becomes $V_{pp}$; however the step-up voltage $V_{pp}$ is still below the expected value $V_{ppe}$, so that the comparison signal $S_1$ remains high (="1").

Next, at time $t_1$, a sampling signal $S_2$ is generated from the sampling signal generating circuit 191, and subsequently, a count-down signal $S_3'$ is generated from the count-down signal generating circuit 19'. As a result, the value N of the down counter 20' is counted down by 1, so that

N=6

In this state (N=6), the step-up voltage $V_{pp}$ is brought close to $V_6$ by the first feedback circuit FBI; that is, the counter 20 is at state N=6, and this signal is fed to selector 15, which selectively chooses $V_6$ by closing the respectively associated switch (switch 156) so that $V_6$ becomes $V_{pp}$; however the step-up voltage $V_{pp}$ is still higher than the expected value $V_{ppe}$, so that the comparison signal $S_1$ remains high (="1").

Next, at time $t_2$, a sampling signal $S_2$ is generated from the sampling signal generating circuit 191, and subsequently, a count-down signal $S_3'$ is generated from the count-down signal generating circuit 19'. As a result, the value N of the down counter 20' is counted down by 1, so that

N=5

In this state (N=5), the step-up voltage $V_{pp}$ is brought close to $V_5$ by the first feedback circuit FBI; that is, the counter 20 is at state N=5, and this signal is fed to selector 15, which selectively chooses $V_5$ by closing the respectively associated switch (switch 155) so that $V_5$ becomes $V_{pp}$; however the step-up voltage $V_{pp}$ is still higher than the expected value $V_{ppe}$, so that the comparison signal $S_1$ remains high (="1").

Next, at time $t_3$, a sampling signal $S_2$ is generated from the sampling signal generating circuit 191, and subsequently, a count-down signal $S_3'$ is generated from the count-down signal generating circuit 19'. As a result, the value N of the down counter 20' is counted down by 1, so that

N=4

In this state (N=4), the step-up voltage $V_{pp}$ is brought close to $V_4$ by the first feedback circuit FBI; so that the step-up voltage $V_{pp}$ is below expected value $V_{ppe}$; that is, the counter 20 is at state N=4, and this signal is fed to selector 15, which selectively chooses $V_4$ by closing the respectively associated switch (switch 154) so that $V_4$ becomes $V_{pp}$. Thus, comparison signal $S_1$ is switched from high ("1") to low (="0"), so that the step-up voltage $V_{pp}$ is close to the expected value $V_{ppe}$.

As a result, upon receipt of the change of the comparison signal $S_1$, the tester 200' stops the generation of the enable signal EN, so that the sampling signal $S_2$ and the count-down signal $S_3'$ are no longer generated. Thus, the adjustment of the value N of the down counter 20' is completed, i.e., the value N of the down counter 20' is fixed at "4".

Finally, the tester 200' supplies a write signal W and an address signal ADD indicating the adjustment area 12b, so that the value "4" of the down counter 20' is stored in the adjustment area of the nonvolatile cell circuit 12.

The post-adjustment operation of the nonvolatile semiconductor memory device of FIG. 4 will be explained next with reference to FIG. 5. Here, assume that the value "3" is stored in adjustment area 12b of the nonvolatile cell circuit 12.

First, a power-on signal PON is generated from a control circuit (not shown) which also generates a read signal RS and an address signal ADD indicating the adjustment area 12b. As a result, the value "4" is set from the adjustment area 12b of the nonvolatile cell circuit 12 to the down counter 20'. As a result, the step-up voltage $V_{pp}$ is brought close to $V_4$ by the first feedback circuit FB1. In this case, since the enable signal EN remains low (="0") due to the presence of a resistor 191a, no sampling signal $S_2$ and no count-down signal $S_3'$ are generated. Thus, the value "4" of the down counter 20' is unchanged.

As explained hereinabove, according to the present invention, since a step-up voltage can be adjusted accurately and quickly, nonvolatile semiconductor memory devices would not be deemed to be defective and scrapped in spite of the fact that the devices can be normally operated, so that the manufacturing yield would be increased.

What is claimed is:

1. A nonvolatile semiconductor memory device including a nonvolatile cell circuit comprising:

a step-up circuit for receiving a clock signal to generate a step-up voltage for said nonvolatile cell circuit;

a voltage divider, connected to said step-up circuit, for dividing said step-up voltage to generate a plurality of voltages;

a selector, connected to said voltage divider, for selecting one of said voltages;

a reference voltage generating circuit for generating a reference voltage;

a first comparator, connected to said selector and said reference voltage generating circuit, for comparing said selected one of said voltages with said reference voltage;

a gate circuit, connected to said first comparator and said step-up circuit, for supplying said clock signal to said step-up circuit in accordance with an output signal of said first comparator so that said selected one of said voltages is brought close to said reference voltage;

a second comparator, connected to said step-up circuit, for comparing said step-up voltage with an externally-provided expected value;

a counting signal generating circuit, connected to said second comparator, for generating a counting signal in accordance with an output signal of said first comparator; and a counter, connected between said counting signal generating circuit and said selector, for changing a value thereof by receiving said counting signal, said selector selecting said one of said voltages in accordance with said value of said counter, so that said step-up voltage is brought close to said expected value.

2. The nonvolatile semiconductor memory device as set forth in claim 1, wherein said voltage divider comprises a ladder of resistors.

3. The nonvolatile semiconductor memory device as set forth in claim 1, wherein said counter comprises an up counter, said counting signal being a count-up signal.

4. The nonvolatile semiconductor memory device as set forth in claim 1, wherein said counter comprises a down counter, said counting signal being a count-down signal.

5. The nonvolatile semiconductor memory device as set forth in claim 1, wherein said counting signal generating circuit comprises:

a sampling signal generating circuit for generating a sampling signal having a predetermined time period; and another gate circuit, connected to said sampling signal generating circuit and said second comparator, for passing said sampling signal in accordance with the output signal of said second comparator.

6. The nonvolatile semiconductor memory device as set forth in claim 5, wherein said sampling signal generating circuit comprises:

another counter for receiving said clock signal to generate said sampling signal; and a further gate circuit, connected to said other counter, for passing said sampling signal in accordance with an externally-provided enable signal.

7. The nonvolatile semiconductor memory device as set forth in claim 6, further comprising a grounded resistor connected to a terminal to which said externally-provided enable signal is applied.

8. The nonvolatile semiconductor memory device as set forth in claim 1, wherein said nonvolatile cell circuit comprises an adjustment area for storing the value of said counter, the value of said counter being stored in the adjustment area of said nonvolatile cell circuit after adjustment of the value of said counter is completed, the value in the adjustment area of said nonvolatile cell circuit being set in said counter in a post-adjustment mode.

9. The nonvolatile semiconductor memory device as set forth in claim 1, further comprising a grounded resistor connected to a terminal to which said externally-provided expected value is applied.

* * * * *

UNITED STATES PATENT AND TRADEMARK OFFICE
CERTIFICATE OF CORRECTION

PATENT NO. : 6,826,085 B2
DATED : November 30, 2004
INVENTOR(S) : Shinya Shimasaki It is certified that error appears in the above-identified patent and that said Letters Patent is hereby corrected as shown below:

<u>Column 2,</u>
Line 20, after "CL." insert -- NG is a value of voltage that is not near enough to the exemplary voltage $V_{ppe}$ to be acceptable. OK is a value of voltage that is near enough to the exemplary voltage $V_{ppe}$ to be acceptable --.

Signed and Sealed this

Thirty-first Day of May, 2005

JON W. DUDAS
*Director of the United States Patent and Trademark Office*